(12) United States Patent
Luan

(10) Patent No.: US 9,419,047 B2
(45) Date of Patent: Aug. 16, 2016

(54) IMAGE SENSOR DEVICE WITH ALIGNED IR FILTER AND DIELECTRIC LAYER AND RELATED METHODS

(71) Applicant: STMICROELECTRONICS (SHENZHEN) R&D CO., LTD., Nanshan, Shenzhen (CN)

(72) Inventor: Jing-En Luan, Shenzhen (CN)

(73) Assignee: STMICROELECTRONICS (SHENZHEN) R&D CO., LTD., Nanshan, Shenzhen (CN)

( * ) Notice: Subject to any disclaimer, the term of this patent is extended or adjusted under 35 U.S.C. 154(b) by 223 days.

(21) Appl. No.: 14/135,743

(22) Filed: Dec. 20, 2013

(65) Prior Publication Data
US 2014/0184809 A1    Jul. 3, 2014

(30) Foreign Application Priority Data
Dec. 31, 2012  (CN) .......................... 2012 1 0596240

(51) Int. Cl.
*H04N 5/33* (2006.01)
*H01L 27/146* (2006.01)
*H04N 5/225* (2006.01)

(52) U.S. Cl.
CPC .... *H01L 27/14683* (2013.01); *H01L 27/14618* (2013.01); *H04N 5/2254* (2013.01); *H04N 5/2257* (2013.01); *H01L 2224/13* (2013.01); *H01L 2224/73265* (2013.01)

(58) Field of Classification Search
CPC ................................................ H01L 27/14683
USPC .......................................................... 348/164
See application file for complete search history.

(56) References Cited

U.S. PATENT DOCUMENTS

| 7,911,017 B1* | 3/2011 | de Guzman ............ G02B 7/021 257/234 |
| 8,305,698 B2 | 11/2012 | Ozaki |
| 8,780,458 B2 | 7/2014 | Sano et al. |
| 2009/0014822 A1* | 1/2009 | Poo ................... H01L 27/14618 257/432 |
| 2009/0057544 A1 | 3/2009 | Brodie et al. |
| 2012/0293704 A1 | 11/2012 | Sano et al. |

FOREIGN PATENT DOCUMENTS

| CN | 101814478 | 8/2010 |
| CN | 102800651 | 11/2012 |
| CN | 203300650 | 11/2013 |

OTHER PUBLICATIONS

U.S. Appl. No. 13/948,507, filed Jul. 23, 2013.
Jing-En Luan, U.S. Appl. No. 14/740,468, filed Jun. 16, 2015.
Wing Shenq Wong, U.S. Appl. No. 14/589,210, filed Jan. 5, 2015.

* cited by examiner

*Primary Examiner* — Richard Torrente
(74) *Attorney, Agent, or Firm* — Allen, Dyer, Doppelt, Milbrath & Gilchrist, P.A.

(57) ABSTRACT

An image sensor device may include an interconnect layer, an image sensor IC adjacent the interconnect layer and having an image sensing surface, and a dielectric layer adjacent the image sensor IC and having an opening therein aligned with the image sensing surface. The image sensor device may also include an IR filter adjacent and aligned with the image sensing surface, and an encapsulation material adjacent the dielectric layer and laterally surrounding the IR filter.

24 Claims, 8 Drawing Sheets

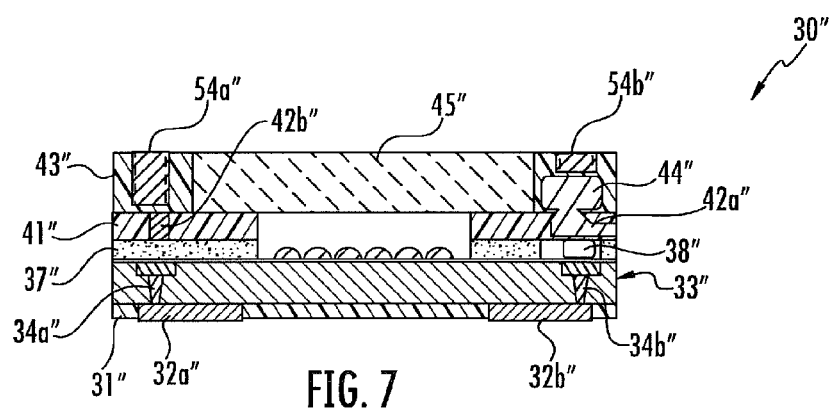
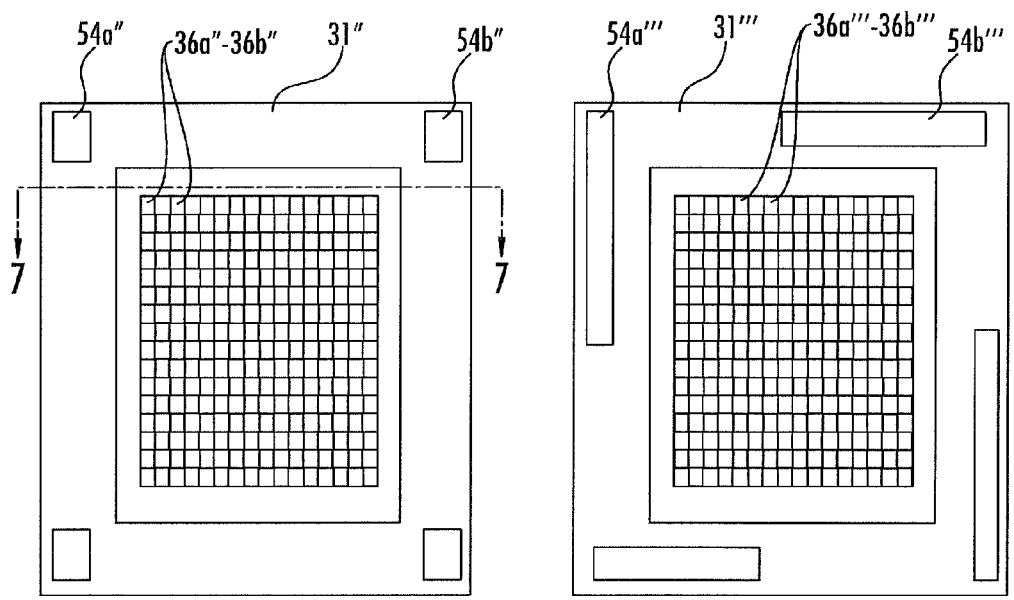

IMAGE SENSOR DEVICE WITH ALIGNED IR FILTER AND DIELECTRIC LAYER AND RELATED METHODS

FIELD OF THE DISCLOSURE

The present disclosure relates to the field of electronic devices, and, more particularly, to image sensors and related methods.

BACKGROUND

Typically, electronic devices include one or more camera modules for providing enhanced media functionality. For example, the typical electronic device may utilize the camera modules for photo capturing and video teleconferencing. In the typical electronic device with multiple camera modules, the primary camera module has a high pixel density and an adjustable focus lens system, while the secondary camera module is front-facing and has a lower pixel density. Also, the secondary camera module may have a fixed focus lens system.

For example, U.S. Patent Application No. 2009/0057544 to Brodie et al, assigned to the present application's assignee, discloses a camera module for a mobile device. The camera module comprises a lens, a housing carrying the lens, and a lens cap over the lens and housing. The camera module includes a barrel mechanism for adjusting the lens. During manufacture of an electronic device including one or more camera modules, there is a desire to manufacture the electronic device as quickly as possible, particularly in mass production runs.

The typical camera module is manufactured in a multi-step process. The first steps include semiconductor processing to provide the image sensor integrated circuit (IC). The next steps include some form of testing for the image sensor IC and packaging. The image sensor IC may be assembled into the camera module, along with a lens and movable barrel if needed. This assembly of the camera module may be performed manually or via machine. For example, in electronic devices that use surface mounted components, a pick-and-place (PNP) machine may assemble the components onto a printed circuit board (PCB). A drawback to such singular packaging is that it may be relatively inefficient and also may require that each device be tested individually, adding to the manufacturing time.

In some applications, it may helpful to manufacture the image sensor IC to include an infrared (IR) filter glass. In one approach, an IR filtering glass is attached over the image sensor IC. A potential drawback to this approach is that the overall thickness of the device may be increased, which may be undesirable for tight fitted mobile applications.

Referring to FIG. 1, an approach to an image sensor device 20 is shown. The image sensor device 20 illustratively includes an interconnect layer 21, an image sensor IC 22 on the interconnect layer, an adhesive layer 29 between the image sensor IC and the interconnect layer, and a plurality of bond wires 23a-23a coupling the image sensor IC to the interconnect layer. The image sensor device 20 illustratively includes a filter holder 25, an IR filter 26 on the filter holder, and an adhesive layer 24 between the filter holder and the interconnect layer 21. Also, the image sensor device 20 illustratively includes a lens module 27 over the IR filter 26, and an adhesive layer 72 coupling the lens module and the filter holder 25 together. The interconnect layer 21 illustratively includes a plurality of contacts 71. The image sensor device 20 illustratively includes another adhesive layer 73 between the IR filter 26 and the filter holder 25.

SUMMARY

In view of the foregoing background, it is therefore an object of the present disclosure to provide an image sensor device that has a low profile and increased image capture resolution.

This and other objects, features, and advantages in accordance with the present disclosure are provided by an image sensor device that may comprise an interconnect layer, an image sensor IC adjacent the interconnect layer and having an image sensing surface, and at least one dielectric layer adjacent the image sensor IC and having an opening therein aligned with the image sensing surface. The image sensor device may also include an IR filter adjacent and aligned with the image sensing surface, and an encapsulation material adjacent the at least one dielectric layer and laterally surrounding the IR filter. Advantageously, the image sensor device may have a smaller profile and is readily manufactured.

The image sensor device may further comprise a lens assembly adjacent the encapsulation material and aligned with the IR filter. The encapsulation material may comprise a plurality of electrically conductive vias extending therethrough and being coupled to the lens assembly.

More specifically, the image sensor IC may comprise a semiconductor substrate, and a plurality of electrically conductive vias extending therethrough. The image sensor device may further comprise an adhesive layer between the image sensor IC and the at least one dielectric layer. The adhesive layer may comprise an electrically conductive material portion coupled to at least one of the plurality of electrically conductive vias.

The at least one dielectric layer may comprise at least one electrically conductive via therein, and the image sensor device may further comprise a capacitor in the encapsulation material and being coupled to the at least one electrically conductive via.

In some embodiments, the image sensor IC may comprise a plurality of micro lenses over the image sensing surface. The interconnect layer may comprise a plurality of electrically conductive vias therethrough, and the image sensor IC may further comprise a plurality of contacts coupled respectively to the plurality of electrically conductive vias. The plurality of contacts may comprise a plurality of ball grid array contacts, for example.

Another aspect is directed to a method of making an image sensor device. The method may comprise forming an interconnect layer, positioning an image sensor IC adjacent the interconnect layer and having an image sensing surface, and forming at least one dielectric layer adjacent the image sensor IC and having an opening therein aligned with the image sensing surface. The method may include positioning an IR filter adjacent and aligned with the image sensing surface, and forming an encapsulation material adjacent the at least one dielectric layer and laterally surrounding the IR filter.

BRIEF DESCRIPTION OF THE DRAWINGS

FIG. 7 is a cross-section view of another embodiment of an image sensor device along line 7-7, according to the present disclosure.

FIG. 8 is a bottom plan view of the image sensor device of FIG. 7.

FIG. 9 is a bottom plan view of another embodiment of the image sensor device, according to the present disclosure.

DETAILED DESCRIPTION OF THE EMBODIMENTS

The present disclosure will now be described more fully hereinafter with reference to the accompanying drawings, in which embodiments of the disclosure are shown. These embodiments may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 1:
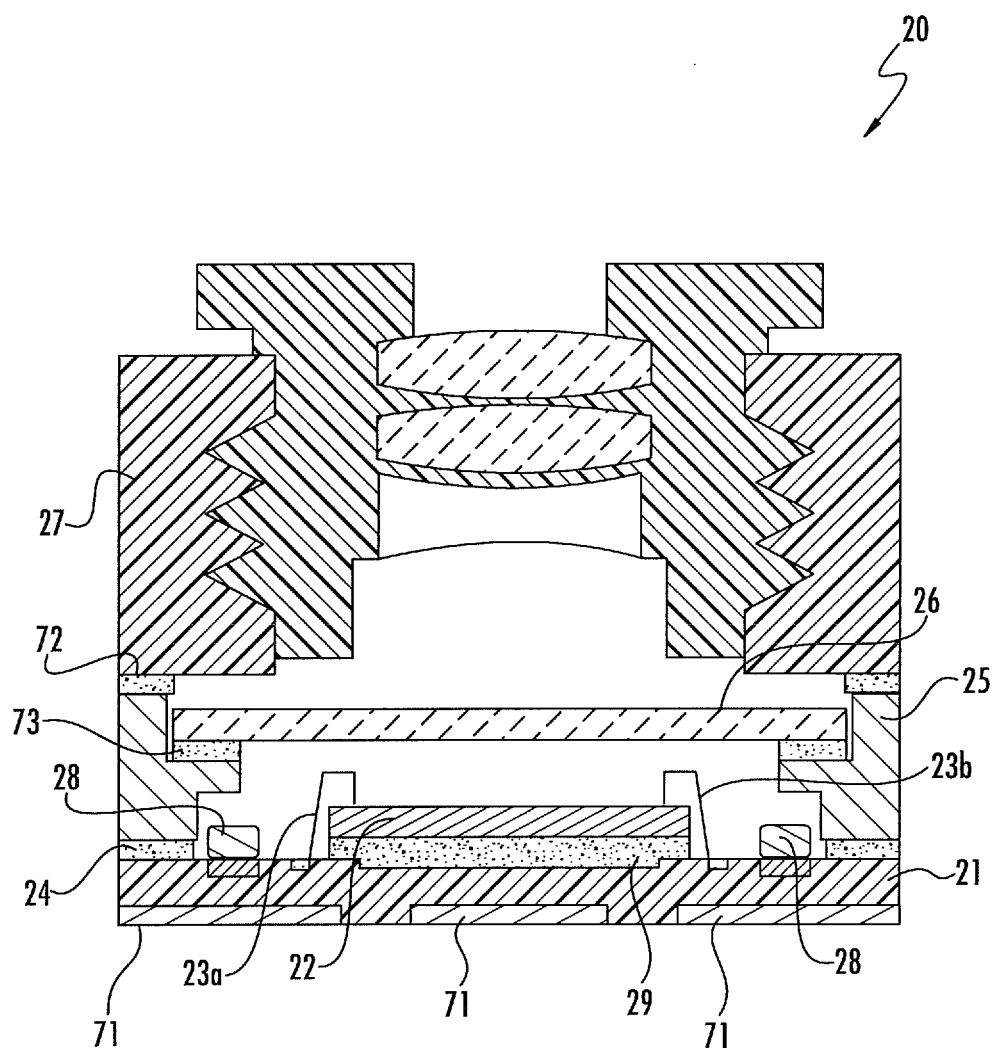
FIG. 1 is a cross-section view of an image sensor device, according to the prior art.
Figure 2:
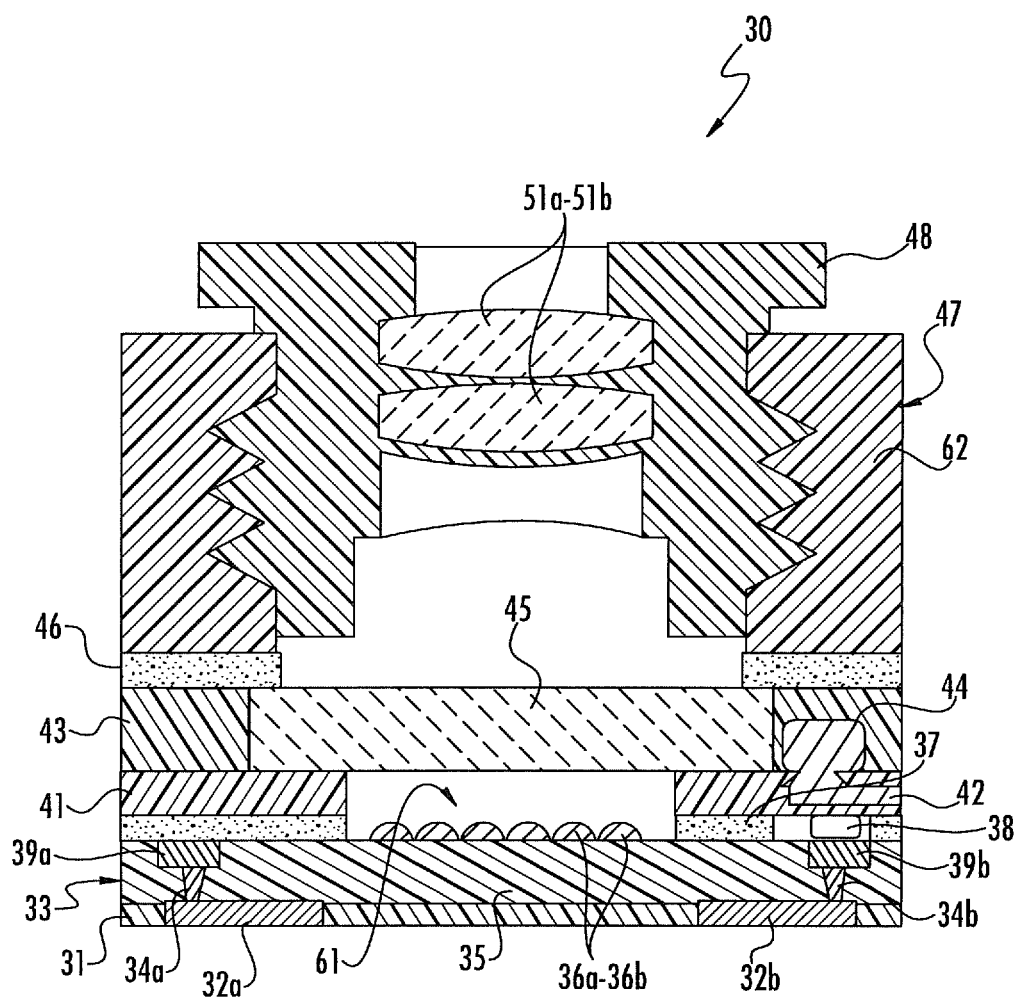
FIG. 2 is a cross-section view of an image sensor device, according to the present disclosure.
Figure 3:
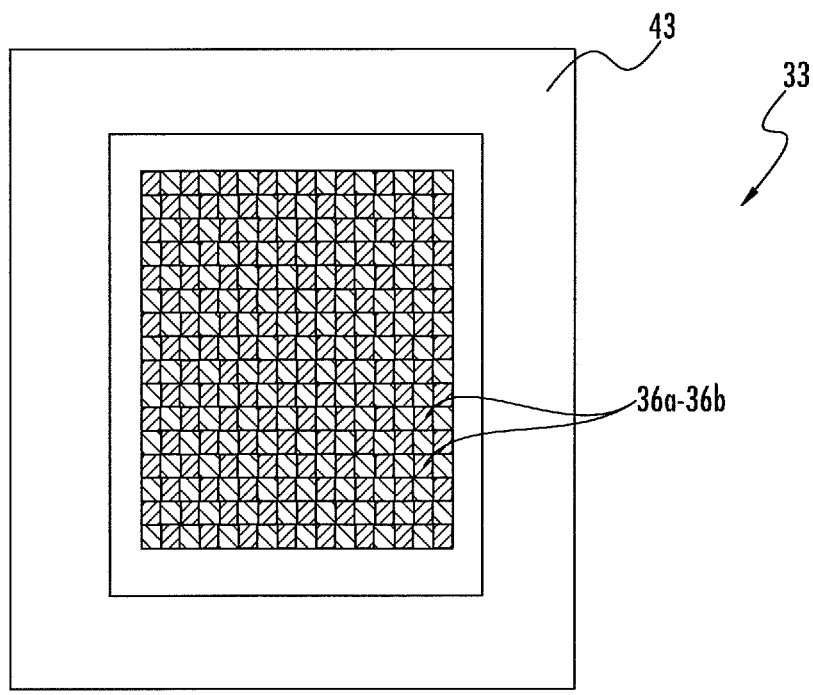
FIG. 3 is a top plan view of the image sensor device of FIG. 1 without the lens assembly.
Figure 4:
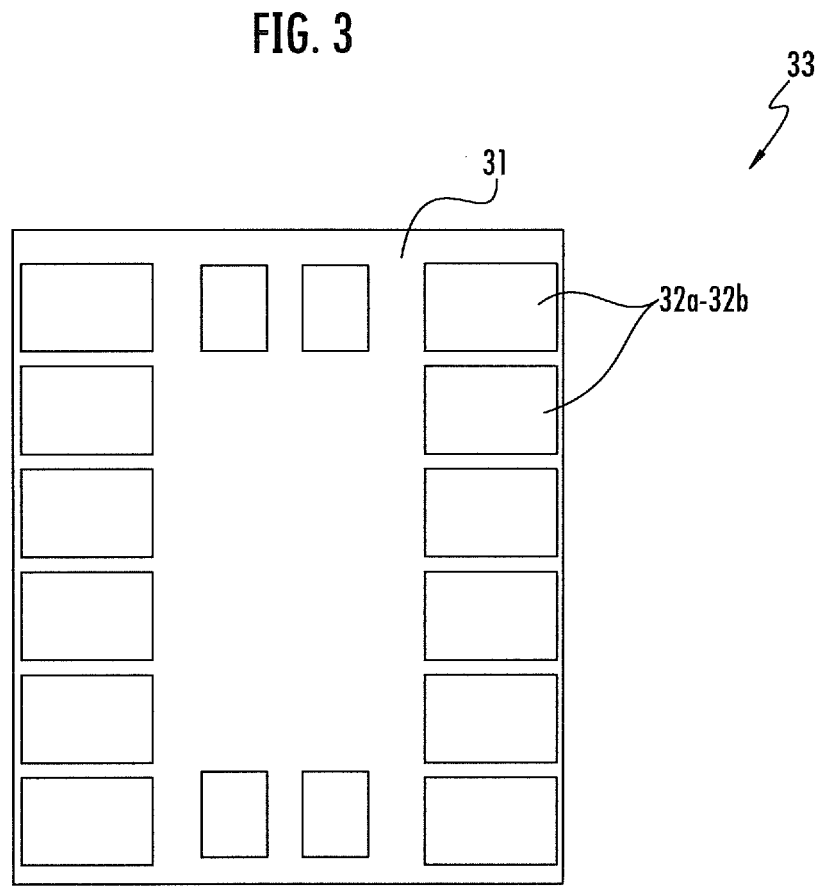
FIG. 4 is a bottom plan view of the image sensor device of FIG. 1.

Referring initially to FIGS. 2-4, an image sensor device 30 according to the present disclosure is now described. The image sensor device 30 illustratively includes an interconnect layer 31, an image sensor IC 33 adjacent the interconnect layer and having an image sensing surface 61, and a dielectric layer 41 adjacent the image sensor IC and having an opening therein aligned with the image sensing surface.

The dielectric layer 41 illustratively comprises an electrically conductive via 42 therein. The image sensor device 30 illustratively includes a capacitor 44 in the encapsulation material 43 and being coupled to the electrically conductive via 42 in the dielectric layer 41. This electrically conductive via 42 has an exposed side contact, providing ready connection to other components.

The image sensor device 30 illustratively includes an IR filter 45 adjacent and aligned with the image sensing surface 61, and an encapsulation material 43 on the dielectric layer 41 and laterally surrounding the IR filter. The encapsulation material 43 is flush with the upper surface of the IR filter 45. The IR filter 45 may comprise a glass layer with an IR coating thereon. The image sensor device 30 comprises a lens assembly 47 adjacent the encapsulation material 43 and aligned with the IR filter 45, and an adhesive layer 46 between the lens module and the encapsulation material. The lens module 47 illustratively includes a housing 62, a lens barrel 48 carried by the housing, and a plurality of lenses 51-51b carried by the lens barrel. The housing 62 may comprise a lens actuator (not shown) for adjusting the position of the lens barrel 48.

More specifically, the image sensor IC 33 illustratively includes a semiconductor substrate 35 (e.g. a through silicon via (TSV) substrate), a plurality of electrically conductive vias 34a-34b extending therethrough, and a plurality of contacts 39a-39b coupled to the electrically conductive vias. In the illustrated embodiment, the image sensor IC 30 comprises a plurality of micro lenses 36a-36b over the image sensing surface 61.

The image sensor device 30 illustratively includes an adhesive layer 37 between the image sensor IC 33 and the dielectric layer 41. The adhesive layer 37 illustratively includes defines a recess with an electrically conductive material portion 38 (e.g. electrically conductive paste) therein. The electrically conductive material portion 38 is coupled to one 34b of the plurality of electrically conductive vias through the respective contact 34b. The interconnect layer 31 illustratively comprises a plurality of electrically conductive vias (pads, landing contacts) 32a-32b therethrough and coupled to the plurality of electrically conductive vias 34a-34b of the image sensor IC 33.

Advantageously, the image sensor device 30 may provide a camera module that has the same size as image sensor IC 33. This embodiment removes the typical bonding wires of the prior art, thereby compacting the size of the device and improving reliability. In particular, the lateral size of the image sensor device 30 is not much wider than that of the image sensor IC 33. Moreover, the space between the imaging surface 61 and the electrically conductive vias 32a-32b may be as low as 50 μm, rather than the >300 μm of the prior art device. The image sensor device 30 may provide integrated electromagnetic shielding, and an embedded passive device.

Figure 5:
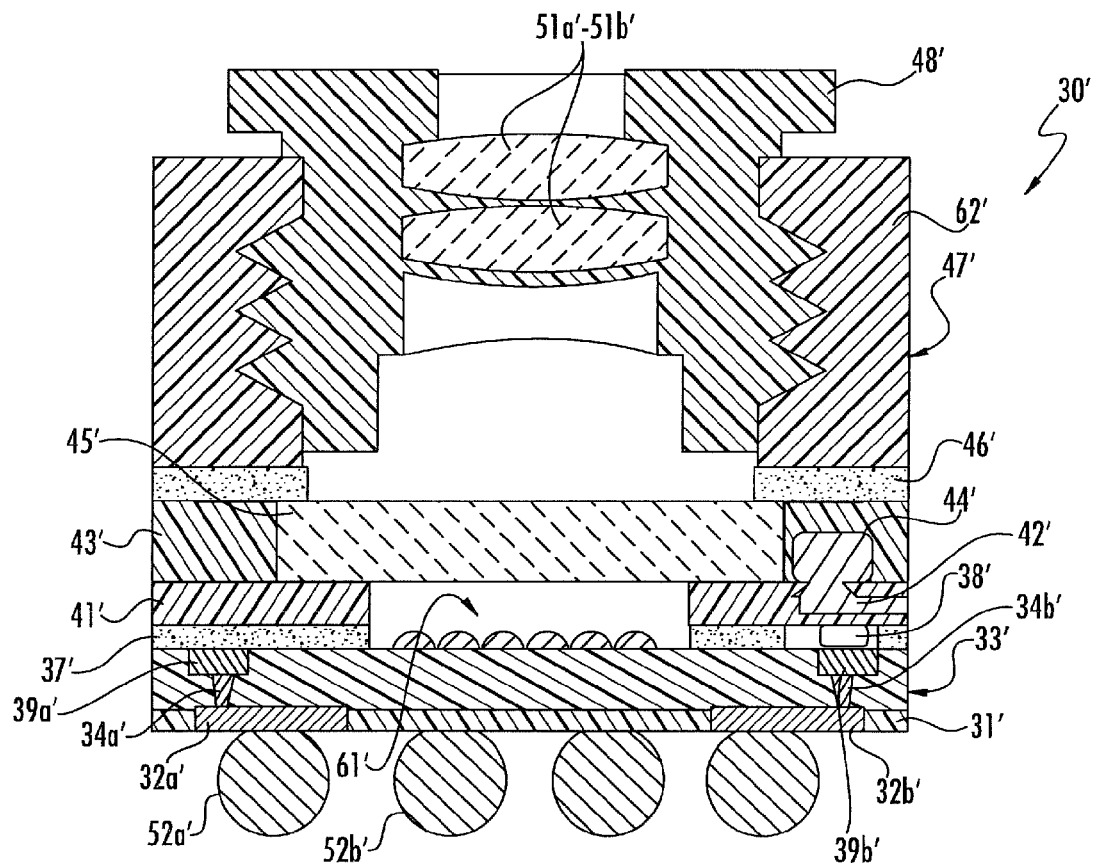
FIG. 5 is a cross-section view of another embodiment of an image sensor device, according to the present disclosure.
Figure 6:
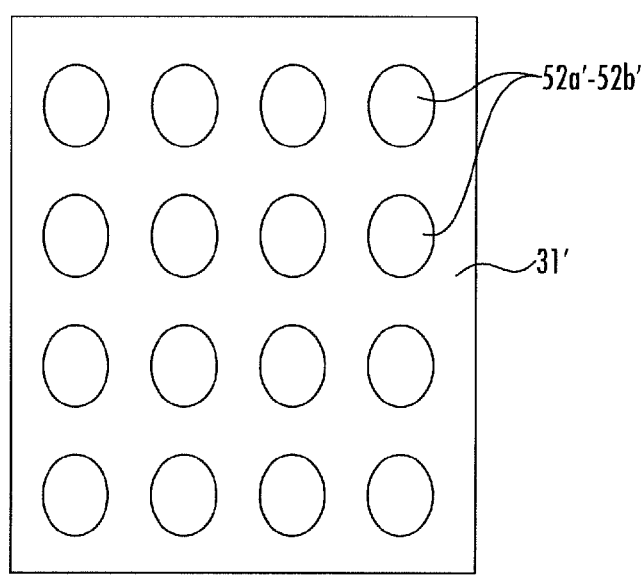
FIG. 6 is a bottom plan view of the image sensor device of FIG. 5.
Figure 10:
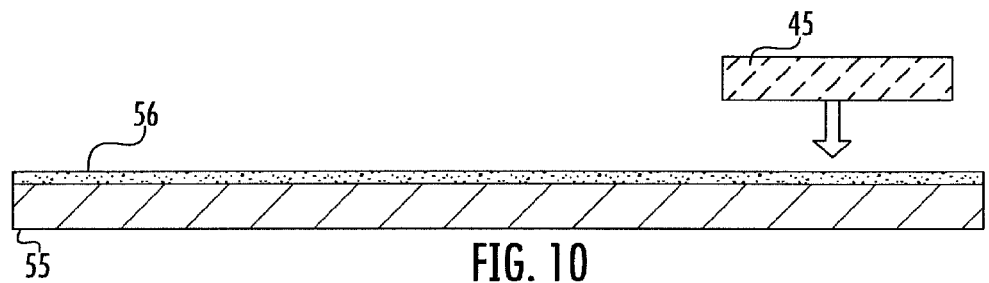
FIGS. 10-18 are cross-section views of steps for forming the image sensor device of FIG. 2.
Figure 11:
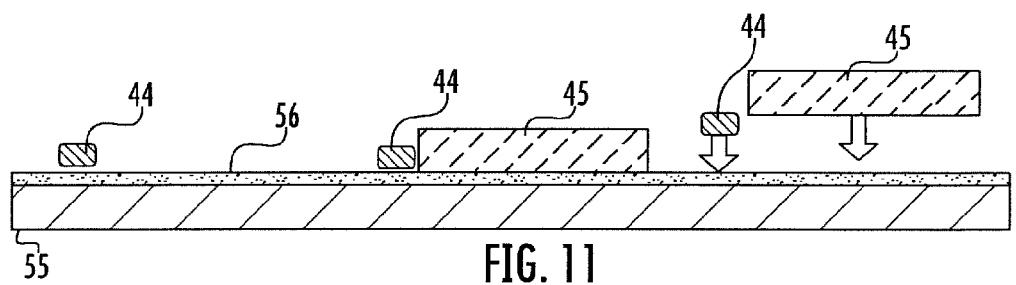
Figure 12:
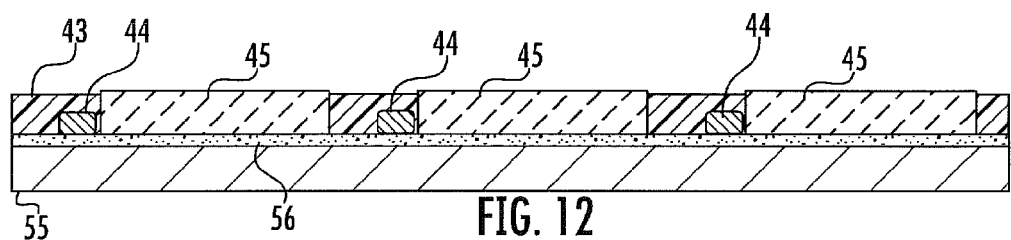
Figure 13:
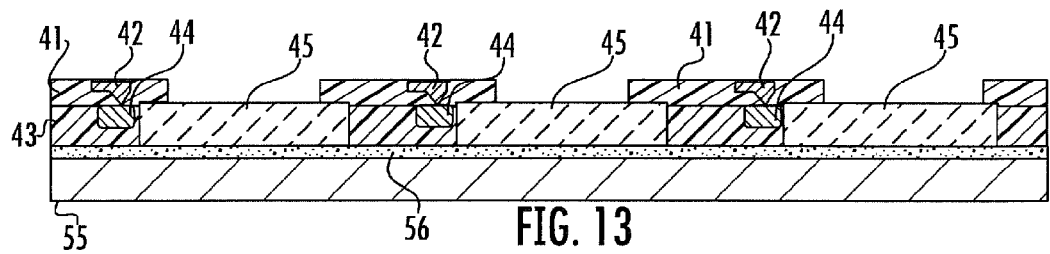
Figure 14:
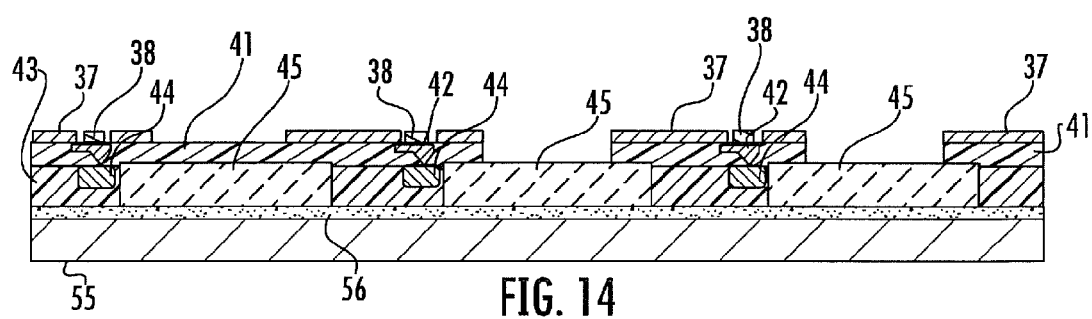
Figure 15:
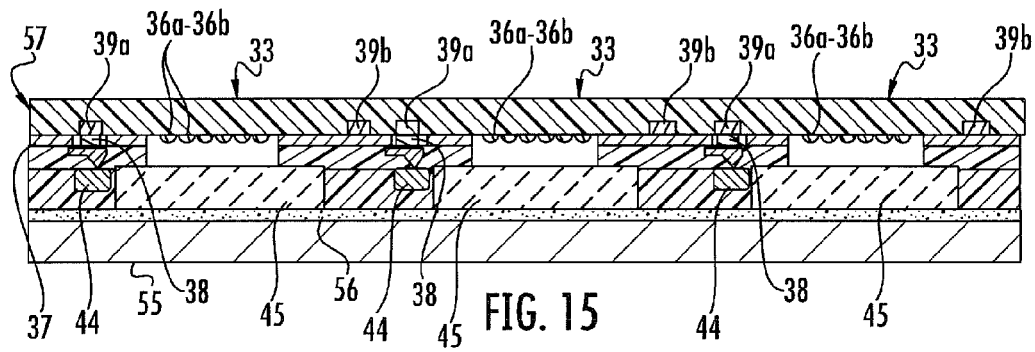
Figure 16:
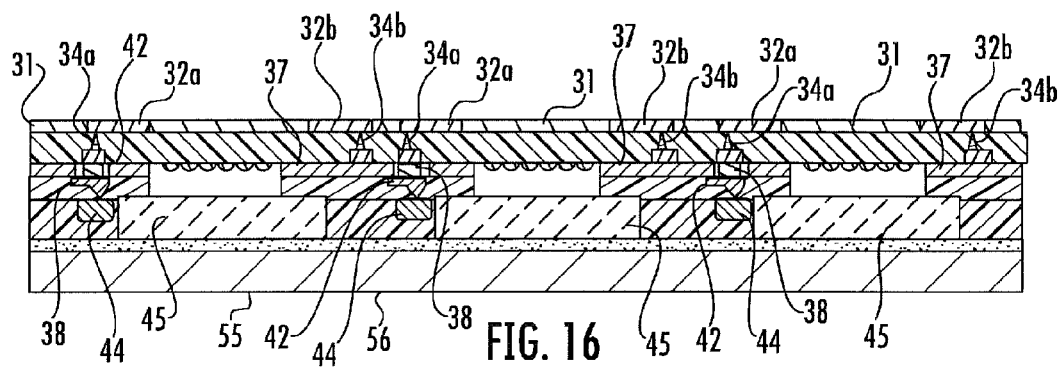
Figure 17:
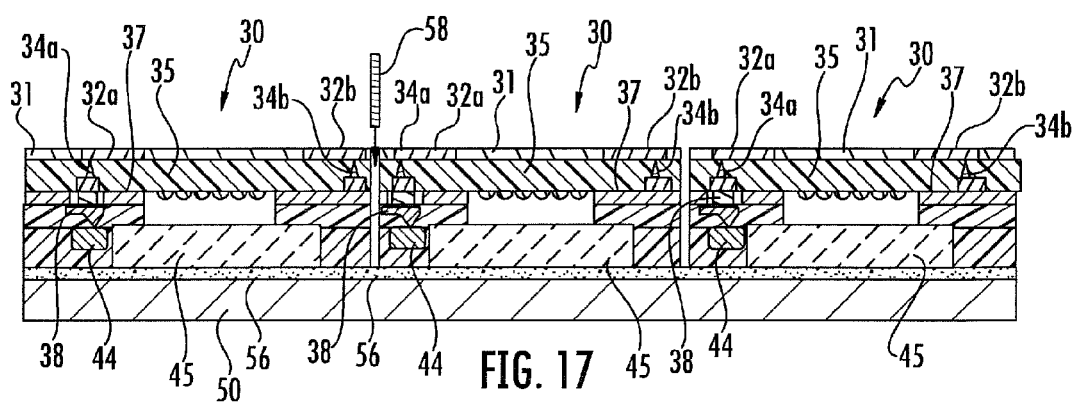
Figure 18:
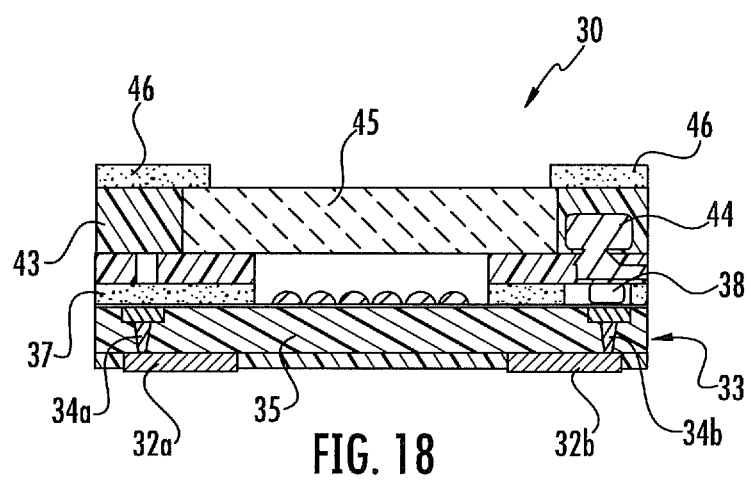

Referring now to FIGS. 5-6, another embodiment of the image sensor device 30' is now described. In this embodiment of the image sensor device 30', those elements already discussed above with respect to FIGS. 2-4 are given prime notation and most require no further discussion herein. This embodiment differs from the previous embodiment in that the image sensor device 30' further includes a plurality of contacts 52a'-52b' coupled respectively to the plurality of electrically conductive vias 32a'-32b'. For example, in the illustrated embodiment, the plurality of contacts 52a'-52b' comprises a plurality of ball grid array contacts, but in other embodiments, other contact types may be used. Also, in this embodiment, the image sensor device 30' may provide a reflowable camera module with solder ball/solder paste etc.

Referring now to FIGS. 7-8, another embodiment of the image sensor device 30" is now described. In this embodiment of the image sensor device 30", those elements already discussed above with respect to FIGS. 2-4 are given double prime notation and most require no further discussion herein. This embodiment differs from the previous embodiment in that the image sensor device 30" further includes the encapsulation material 43" comprising a plurality of electrically conductive vias 54a"-54b" extending therethrough and to be coupled to the lens assembly (not shown). The electrically conductive vias 54a"-54b" may form pads for coupling to electromagnetic shielding or connect to an actuator in the lens assembly 47 (for autofocus, Zoom etc.).

Referring now to FIG. 9, another embodiment of the image sensor device 30''' is now described. In this embodiment of the image sensor device 30''', those elements already discussed above with respect to FIGS. 2-4 are given triple prime notation and most require no further discussion herein. This embodiment differs from the previous embodiment in that the plurality of electrically conductive vias 54a'''-54b''' extending through the encapsulation material 43''' are rectangular in shape and provide larger surface contacts.

Referring now additionally to FIGS. 10-18, a method of making the image sensor device 30 is now described. The method comprises forming an interconnect layer 31, positioning an image sensor IC 33 adjacent the interconnect layer and having an image sensing surface 61, and forming at least one dielectric layer 41 adjacent the image sensor IC and having an opening therein aligned with the image sensing surface. The method may include positioning an IR filter 45 adjacent and aligned with the image sensing surface 61, and forming an encapsulation material 43 adjacent the at least one dielectric layer 41 and laterally surrounding the IR filter.

In particular, the process is performed at the wafer level, thereby providing an efficient manufacturing process. In the illustrated embodiment, only three image sensor devices 30 are made, but it will be readily appreciated that many more can be manufactured at the same time using wafer level processing. The method illustratively includes providing a carrier layer 55 (e.g. glass layer), and an adhesive layer 56 thereon. The method illustratively includes placing the IR filters 45, and the capacitors 44 on the adhesive layer 56. The method illustratively includes forming the encapsulation material 43 to cover the capacitors 44 and surround the IR filters 45. The method illustratively includes forming the dielectric layer 41 and the electrically conductive vias 42 therein, and forming the adhesive layer 37 on the dielectric layer. The method also includes forming the electrically conductive material portions 38 in respective recesses defined in the adhesive layer 37. The method illustratively includes positioning a wafer 57 including a plurality of image sensor ICs 33 on the adhesive layer 37, and forming the interconnect layer 31 on the backside of the image sensor IC wafer. The method may include grinding down the thickness of the substrate 35 of the wafer 57, and forming redistribution layers therein. The method also illustratively includes singulating the image sensor ICs 30 using a saw 58. Subsequent to singulation, the method illustratively includes forming the adhesive layer 46 on the encapsulation material 43, and placing the lens assembly 47 on the adhesive layer.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An image sensor device comprising:
   an interconnect layer comprising a first dielectric layer, and a plurality of electrically conductive vias extending through said first dielectric layer;
   an image sensor integrated circuit (IC) adjacent said interconnect layer and having an image sensing surface;
   at least one second dielectric layer adjacent said image sensor IC and having an opening therein aligned with the image sensing surface;
   an infrared (IR) filter adjacent and aligned with the image sensing surface; and
   an encapsulation material adjacent said at least one second dielectric layer and laterally contacting said IR filter around the periphery thereof.

2. The image sensor device of claim 1 further comprising a lens assembly adjacent said encapsulation material and aligned with said IR filter.

3. The image sensor device of claim 2 wherein said encapsulation material comprises a plurality of electrically conductive vias extending therethrough and being coupled to said lens assembly.

4. The image sensor device of claim 1 wherein said image sensor IC comprises a semiconductor substrate, and a plurality of electrically conductive vias extending therethrough.

5. The image sensor device of claim 4 further comprising an adhesive layer between said image sensor IC and said at least one second dielectric layer, said adhesive layer comprising an electrically conductive material portion coupled to at least one of said plurality of electrically conductive vias of said image sensor IC.

6. The image sensor device of claim 1 wherein said at least one second dielectric layer comprises at least one electrically conductive via therein; and further comprising a capacitor in said encapsulation material and being coupled to said at least one electrically conductive via of said at least one second dielectric layer.

7. The image sensor device of claim 1 wherein said image sensor IC comprises a plurality of micro lenses over said image sensing surface.

8. The image sensor device of claim 1 further comprising a plurality of contacts coupled respectively to said plurality of electrically conductive vias.

9. The image sensor device of claim 8 wherein said plurality of contacts comprises a plurality of ball grid array contacts.

10. An image sensor device comprising:
    an interconnect layer comprising a first dielectric layer, and a plurality of electrically conductive vias extending through said first dielectric layer;
    an image sensor integrated circuit (IC) adjacent said interconnect layer and comprising an image sensing surface, and a plurality of micro lenses over said image sensing surface;
    at least one second dielectric layer adjacent said image sensor IC and having an opening therein aligned with the image sensing surface;
    an infrared (IR) filter adjacent and aligned with the image sensing surface;
    an encapsulation material adjacent said at least one second dielectric layer and laterally contacting said IR filter around the periphery thereof; and
    a lens assembly adjacent said encapsulation material and aligned with said IR filter.

11. The image sensor device of claim 10 wherein said encapsulation material comprises a plurality of electrically conductive vias extending therethrough and being coupled to said lens assembly.

12. The image sensor device of claim 10 wherein said image sensor IC comprises a semiconductor substrate, and a plurality of electrically conductive vias extending therethrough.

13. The image sensor device of claim 12 further comprising an adhesive layer between said image sensor IC and said at least one second dielectric layer, said adhesive layer comprising an electrically conductive material portion coupled to at least one of said plurality of electrically conductive vias of said image sensor IC.

14. The image sensor device of claim 10 wherein said at least one second dielectric layer comprises at least one electrically conductive via therein; and further comprising a capacitor in said encapsulation material and being coupled to said at least one electrically conductive via of said at least one second dielectric layer.

15. The image sensor device of claim 10 further comprising a plurality of contacts coupled respectively to said plurality of electrically conductive vias.

16. A method of making an image sensor device comprising:
    forming an interconnect layer comprising a first dielectric layer, and a plurality of electrically conductive vias extending through the first dielectric layer;
    positioning an image sensor integrated circuit (IC) adjacent the interconnect layer and having an image sensing surface;

forming at least one second dielectric layer adjacent the image sensor IC and having an opening therein aligned with the image sensing surface;

positioning an infrared (IR) filter adjacent and aligned with the image sensing surface; and forming an encapsulation material adjacent the at least one second dielectric layer and laterally contacting the IR filter around the periphery thereof.

17. The method of claim 16 further comprising positioning a lens assembly adjacent the encapsulation material and aligned with the IR filter.

18. The method of claim 17 further comprising forming the encapsulation material to comprise a plurality of electrically conductive vias extending therethrough and to be coupled to the lens assembly.

19. The method of claim 16 wherein the image sensor IC comprises a semiconductor substrate, and a plurality of electrically conductive vias extending therethrough.

20. The method of claim 19 further comprising forming an adhesive layer between the image sensor IC and the at least one second dielectric layer, the adhesive layer comprising an electrically conductive material portion to be coupled to at least one of the plurality of electrically conductive vias of the image sensor IC.

21. The method of claim 16 wherein the at least one second dielectric layer comprises at least one electrically conductive via therein; and further comprising positioning a capacitor in the encapsulation material and to be coupled to the at least one electrically conductive via of the at least one second dielectric layer.

22. The method of claim 16 wherein the image sensor IC comprises a plurality of micro lenses over the image sensing surface.

23. The method of claim 16 further comprising forming a plurality of contacts coupled respectively to the plurality of electrically conductive vias.

24. The method of claim 23 wherein the plurality of contacts comprises a plurality of ball grid array contacts.

* * * * *